US006992358B2

(12) United States Patent
Hieda et al.

(10) Patent No.: US 6,992,358 B2
(45) Date of Patent: Jan. 31, 2006

(54) SEMICONDUCTOR DEVICE AND METHOD FOR MANUFACTURING THE SAME

(75) Inventors: Katsuhiko Hieda, Yokohama (JP); Kazuya Matsuzawa, Kawasaki (JP); Daisuke Hagishima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/874,732

(22) Filed: Jun. 24, 2004

(65) Prior Publication Data

US 2005/0121703 A1 Jun. 9, 2005

(30) Foreign Application Priority Data

Dec. 5, 2003 (JP) .............................. 2003-407367

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ...................... 257/407; 257/347; 257/349; 257/354

(58) Field of Classification Search ........ 257/347–354, 257/407
See application file for complete search history.

(56) References Cited

U.S. PATENT DOCUMENTS

| 4,979,014 | A | 12/1990 | Hieda et al. | |
| 6,437,404 | B1 * | 8/2002 | Xiang et al. | 257/347 |
| 6,538,916 | B2 * | 3/2003 | Ohsawa | 365/149 |
| 6,580,132 | B1 * | 6/2003 | Chan et al. | 257/365 |
| 6,639,246 | B2 * | 10/2003 | Honda | 257/72 |
| 6,646,307 | B1 * | 11/2003 | Yu et al. | 257/347 |
| 6,687,152 | B2 * | 2/2004 | Ohsawa | 365/149 |
| 6,724,046 | B2 * | 4/2004 | Oyamatsu | 257/347 |
| 6,740,938 | B2 * | 5/2004 | Tsunoda et al. | 257/365 |
| 6,744,390 | B1 * | 6/2004 | Stice | 341/120 |
| 6,800,513 | B2 * | 10/2004 | Horiuchi et al. | 438/157 |
| 6,822,071 | B1 * | 11/2004 | Stephens et al. | 530/300 |
| 2003/0209761 | A1 * | 11/2003 | Yagishita et al. | 257/347 |
| 2004/0150520 | A1 * | 8/2004 | Barrie | 340/539.13 |
| 2004/0178451 | A1 * | 9/2004 | Yagishita et al. | 257/347 |
| 2005/0040464 | A1 * | 2/2005 | Miura | 257/347 |
| 2005/0051843 | A1 * | 3/2005 | Inaba | 257/347 |
| 2005/0110085 | A1 * | 5/2005 | Zhu et al. | 257/347 |

OTHER PUBLICATIONS

Yang et al.; "25 nm CMOS Omega FETs"; IEDM, pp. 255-258, (2002).

(Continued)

*Primary Examiner*—Tom Thomas
*Assistant Examiner*—Jesse A. Fenty
(74) *Attorney, Agent, or Firm*—Finnegan, Henderson, Farabow, Garrett & Dunner, L.L.P.

(57) ABSTRACT

Disclosed is a semiconductor device comprising an underlying insulating film having a depression, a semiconductor structure which includes a first semiconductor portion having a portion formed on the underlying insulating film and a first overlap portion which overlaps the depression, a second semiconductor portion having a portion formed on the underlying insulating film and a second overlap portion which overlaps the depression, and a third semiconductor portion disposed between the first and second semiconductor portions and having a portion disposed above the depression, wherein overlap width of the first overlap portion and overlap width of the second overlap portion are equal to each other, a gate electrode including a first electrode portion covering upper and side surfaces of the third semiconductor portion and a second electrode portion formed in the depression, and a gate insulating film interposed between the semiconductor structure and the gate electrode.

12 Claims, 13 Drawing Sheets

OTHER PUBLICATIONS

Colinge et al.; "Silicon-on-Insulator "Gate-all-Around Device""; IEDM, pp. 595-598, (1990).

Hieda; "Semiconductor Device and Method for Manufacturing the Same"; U.S. Appl. No. 09/916,509, filed Jul. 30, 2001.

* cited by examiner

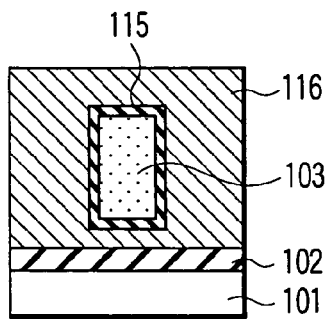
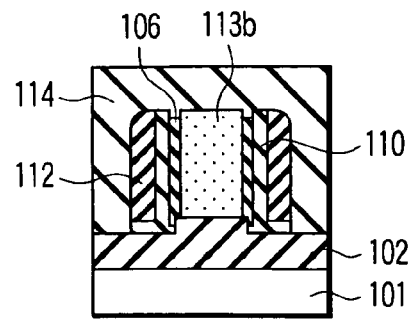
FIG. 3A  FIG. 3C
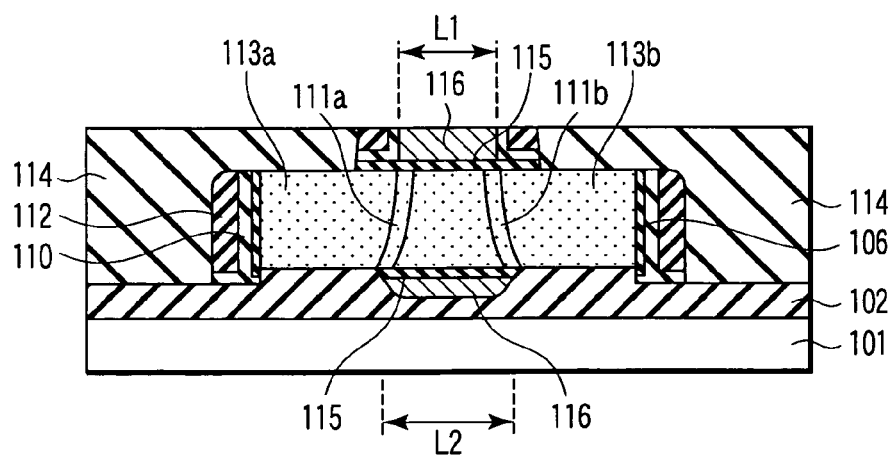
FIG. 3B
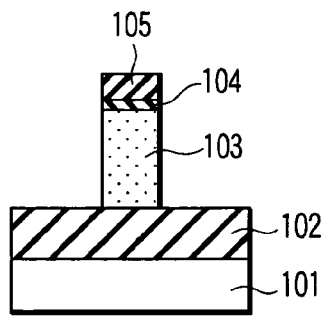
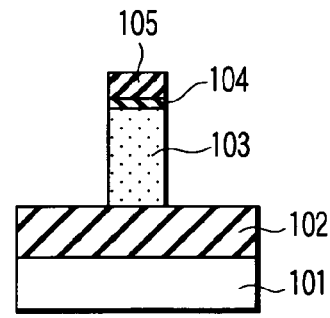
FIG. 4A  FIG. 4C
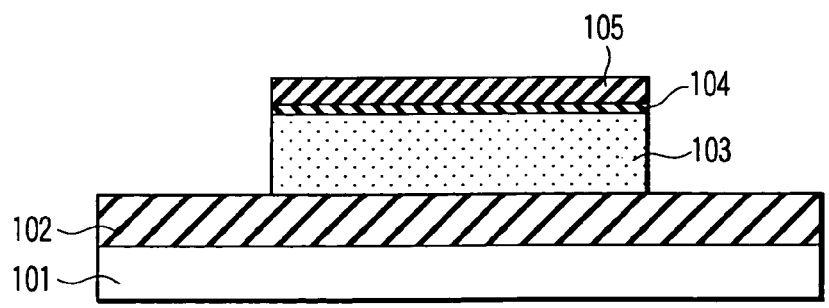
FIG. 4B

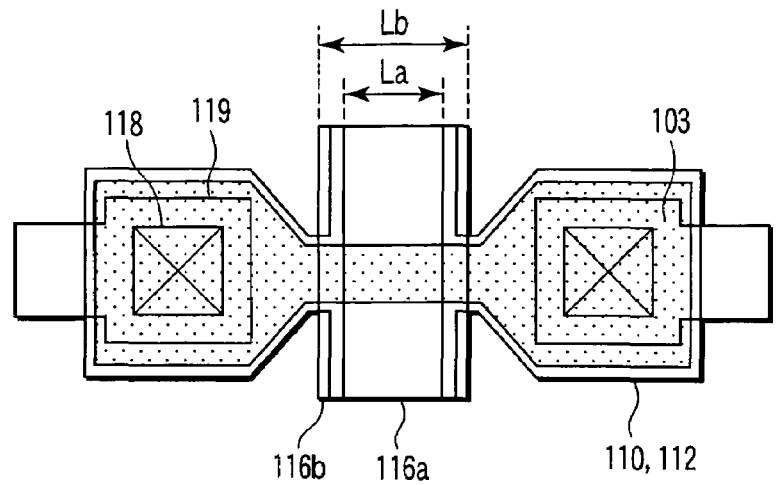
F I G. 20
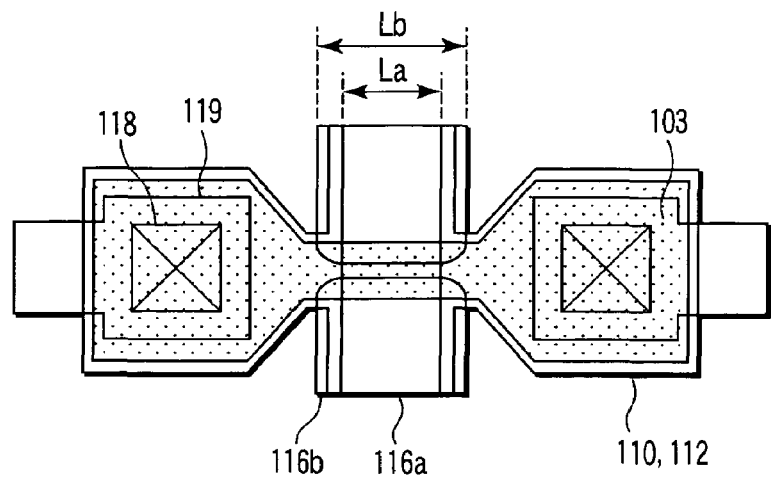
F I G. 21
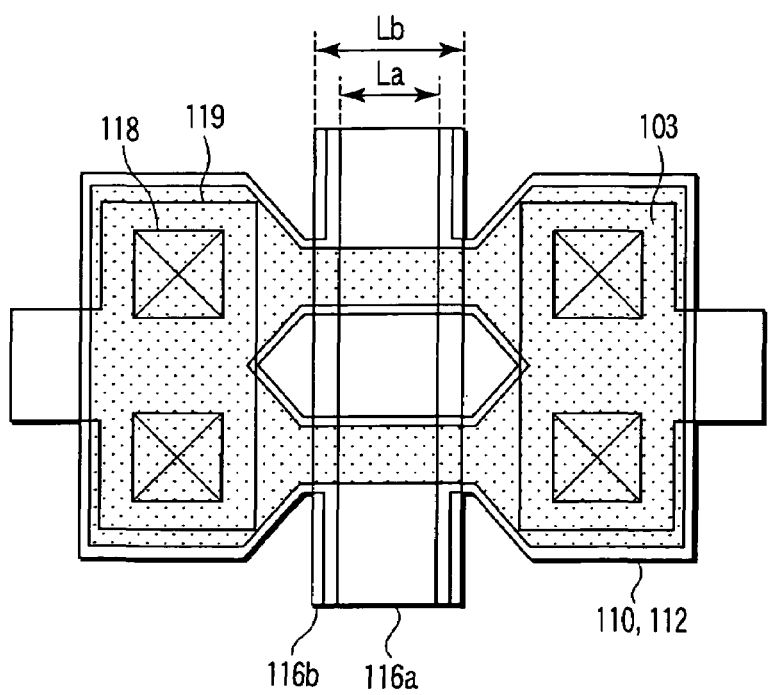
F I G. 22

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2003-407367, filed Dec. 5, 2003, the entire contents of which are incorporated herein by reference.

BACKGROUND OF THE INVENTION

1. Field of the Invention

This invention relates to a semiconductor device and a method for manufacturing the same.

2. Description of the Related Art

MIS transistors are miniaturized and the gate lengths (channel lengths) thereof are made shorter. As the channel length becomes shorter, a punch-through phenomenon more easily tends to occur between the source and drain, and degradation of the transistor characteristic, for example, an increase in the leakage current will be caused.

In order to solve the above problem, a MIS transistor (Gate-All-Around structure MIS transistor) having an island-form semiconductor structure formed with a rectangular parallelepiped form on a substrate and surrounded by a gate electrode is proposed in a document 1 (J. P. Colinge et al., "SILICON-ON-INSULATOR 'GATE-ALL-AROUND DEVICE'", IEDM 1990, 25. 4, pp. 595–598). The MIS transistor is formed as follows. First, an island-form semiconductor structure is formed on a buried oxide film (BOX film). Then, the buried oxide film is etched by the use of a photoresist mask to form a cavity in a region directly under a channel forming region of the island-form semiconductor structure and a region around the above region. Next, a gate electrode material film is formed on the entire surface containing the cavity and the gate electrode material film is patterned to form a gate electrode which crosses the island-form semiconductor structure. Thus, the gate electrode which surrounds the channel forming region of the island-form semiconductor structure is formed. Since the island-form semiconductor structure also functions as an etching mask when the gate electrode material film is patterned, the gate electrode is formed to have extension portions in the cavity under the source and drain regions.

However, in the above proposal, the cavity and gate electrode are formed by the use of lithography technology. In lithography technology, since an alignment error occurs, a gate electrode pattern will be formed in position shifted from the center of the cavity pattern. As a result, the width of the extension portion of the gate electrode which lies under the source region becomes greatly different from the width of the extension portion thereof lying under the drain region. Therefore, only one of the overlap capacitance between the gate and source and the overlap capacitance between the gate and drain becomes larger, having a bad effect on the characteristic of the MIS transistor. Further, it is necessary to form a cavity pattern of large size when taking a margin for the alignment error into consideration and this leads to an increase in the overlap capacitance.

Further, a MIS transistor (Omega-Fin structure MIS transistor) having an island-form semiconductor structure surrounded by a gate electrode except the central portion of the undersurface of the island-form semiconductor structure is proposed in a document 2 (Fu-Liang Yang et al., "25 nm CMOS Omega FETs", IEDM 2002, 10. 3, pp. 255–258). The MIS transistor is formed as follows. First, an island-form semiconductor structure is formed on a buried oxide film. Then, the buried oxide film is etched with the island-form semiconductor structure used as a mask to form a depression portion in the buried oxide film. At this time, the buried oxide film under the end portion of the island-form semiconductor structure is also etched to from an undercut portion under the island-form semiconductor structure. Next, a gate electrode material film is formed on the entire surface containing the undercut portion and the gate electrode material film is patterned to form a gate electrode which crosses the island-form semiconductor structure.

In the above proposal, the gate electrode is not formed in a position corresponding to the undercut portion under the source and drain regions. That is, unlike the proposal of the document 1, the gate electrode has no extension portion under the source and drain regions. When the source/drain region is formed by ion implantation, the distance between the source and drain regions is generally longer in the lower portion of the island-form semiconductor structure than in the upper portion thereof. In the document 2, since the gate electrode has no extension portion under the source and drain regions, offsets occur between the gate electrode and the source region and between the gate electrode and the drain region to significantly degrade the characteristics of the MIS transistor. Further, in the above proposal, since the undercut portion is formed in the entire portion under the island-form semiconductor structure, it is difficult to sufficiently fixedly hold the island-form semiconductor structure and there occurs a problem that the island-form semiconductor structure will fall down in the manufacturing process.

Thus, from the viewpoint of preventing occurrence of the punch-through phenomenon between the source and drain, Gate-All-Around structure MIS transistors and Omega-Fin structure MIS transistors are proposed. However, conventional MIS transistors with the above structures have a problem that the positional relationship between the gate electrode and the source/drain region cannot be optimized. Thus, it is difficult to attain a semiconductor device which has excellent characteristics and reliability.

BRIEF SUMMARY OF THE INVENTION

A semiconductor device according to a first aspect of the invention comprises an underlying insulating film having a depression; a semiconductor structure which includes a first semiconductor portion having a portion formed on the underlying insulating film and a first overlap portion which overlaps the depression and containing an impurity element for source/drain, a second semiconductor portion having a portion formed on the underlying insulating film and a second overlap portion which overlaps the depression and is disposed to face the first overlap portion and containing an impurity element for source/drain, and a third semiconductor portion disposed between the first and second semiconductor portions and having a portion disposed above the depression, wherein overlap width of the first overlap portion and overlap width of the second overlap portion are equal to each other; a gate electrode including a first electrode portion covering upper and side surfaces of the third semiconductor portion and a second electrode portion formed in the depression; and a gate insulating film interposed between the semiconductor structure and the gate electrode.

A method of manufacturing a semiconductor device according to a second aspect of the invention comprises forming a semiconductor structure which includes a first semiconductor portion, a second semiconductor portion and a third semiconductor portion disposed between the first and second semiconductor portions, on an underlying insulating film; forming a dummy structure covering upper and side surfaces of the third semiconductor portion; forming an insulating portion covering a surface of the first semiconductor portion, a surface of the second semiconductor portion and a side surface of the dummy structure; removing the dummy structure to expose the third semiconductor portion and the underlying insulating film under the dummy structure; forming a depression in the underlying insulating film by etching an exposed portion and a portion adjacent to the exposed portion of the underlying insulating film; and forming a gate electrode with a gate insulating film interposed between the third semiconductor portion and the gate electrode, the gate electrode including a first electrode portion covering upper and side surfaces of the third semiconductor portion and a second electrode portion formed in the depression.

BRIEF DESCRIPTION OF THE SEVERAL VIEWS OF THE DRAWING

FIGS. 3A to 3C are cross-sectional views each schematically showing the basic configuration of the semiconductor device according to the first embodiment of this invention;

FIGS. 4A to 4C are cross-sectional views showing part of a manufacturing process of the semiconductor device according to the first embodiment of this invention;

FIG. 20 is a plan view schematically showing one example of the basic configuration of a semiconductor device according to a third embodiment of this invention;

FIG. 21 is a plan view schematically showing another example of the basic configuration of the semiconductor device according to the third embodiment of this invention;

FIG. 22 is a plan view schematically showing one example of the basic configuration of a semiconductor device according to a fourth embodiment of this invention;

DETAILED DESCRIPTION OF THE INVENTION

There will now be described embodiments of this invention with reference to the accompanying drawings.

Embodiment 1

Figure 1:
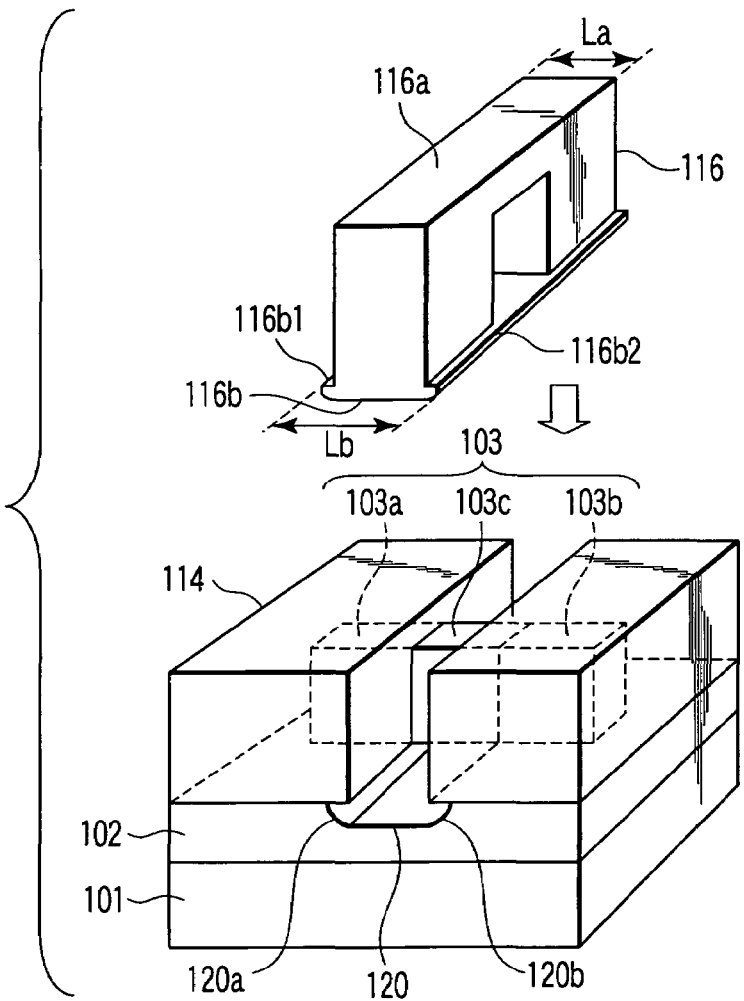
FIG. 1 is a perspective view schematically showing the basic configuration of a semiconductor device according to a first embodiment of this invention.
Figure 2:
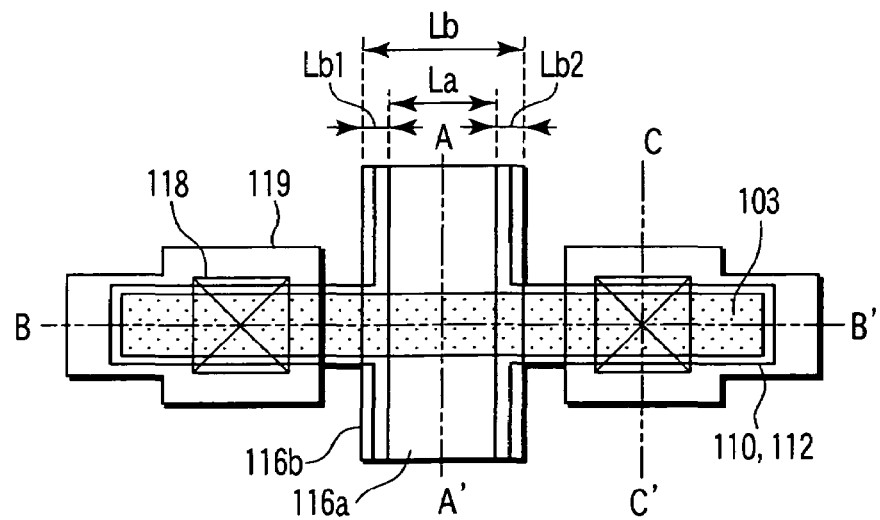
FIG. 2 is a plan view schematically showing the basic configuration of the semiconductor device according to the first embodiment of this invention.

FIG. 1 is a perspective view schematically showing the basic configuration of a semiconductor device according to a first embodiment of this invention and FIG. 2 is a plan view showing the semiconductor device of FIG. 1. FIG. 3A is a cross sectional view taken along the A–A' line of FIG. 2, FIG. 3B is a cross sectional view taken along the B–B' line of FIG. 2 and FIG. 3C is a cross sectional view taken along the C–C' line of FIG. 2. In FIG. 1, for easy understanding of the structure, the gate electrode is shown separately from the other structure, but in practice, the gate electrode is formed in contact with the other structure. Further, in FIG. 1 and FIGS. 3A to 3C, contacts and wirings shown in FIG. 2 are omitted.

A buried oxide film (BOX film) 102 having a depression portion 120 is formed as a underlying insulating film on a p-type silicon substrate (semiconductor substrate) 101 with an impurity concentration of approximately $5 \times 10^{15}$ cm$^{-3}$.

An island-form semiconductor structure 103 formed of single crystal silicon is formed on the buried oxide film 102. The semiconductor structure 103 has a semiconductor portion 103a, a semiconductor portion 103b and a semiconductor portion 103c disposed between the semiconductor portions 103a and 103b. The width of the semiconductor structure 103 in the channel width direction is approximately 20 nm and the height thereof is approximately 20 nm.

Impurities of low concentration (approximately $5 \times 10^{17}$ $cm^{-3}$ or lower) are contained in the channel forming region of a transistor. Further, source and drain regions (source and drain regions 111a and 111b of low concentration, source and drain regions 113a and 113b of high concentration) are formed on both sides of the channel forming region.

A gate electrode 116 has an electrode portion 116a disposed to cover the upper and side surfaces of the semiconductor portion 103c and an electrode portion 116b formed in the depression portion 120 of the buried oxide film 102. The semiconductor structure 103 is surrounded by the electrode portions 116a and 116b and a region surrounded by the electrode portion 116a corresponds to the semiconductor portion 103c. Further, a gate insulating film 115 is disposed between the gate electrode 116 and the semiconductor structure 103.

Silicon nitride films 110 and silicon oxide films 112 are formed as side wall insulating films on both sides of the electrode portion 116a and interlayer insulating films 114 are formed outside the side wall insulating films. The surfaces of the semiconductor portions 103a and 103b are covered with the insulating portions formed of the side wall insulating films and interlayer insulating films 114. In FIG. 1, the silicon nitride films 110 and silicon oxide films 112 are not drawn, but the silicon nitride films 110 and silicon oxide films 112 are formed in regions of the interlayer insulating films 114 which face each other with the gate electrode 116 disposed therebetween.

In the present embodiment, as shown in FIG. 1, the depression portion 120 formed in the buried oxide film 102 has extension portions 120a and 120b. Since the extension portions 120a and 120b are formed by an isotropic etching process as will be described later, the widths of the extension portions 120a and 120b are equal to each other. That is, the width of a portion of the semiconductor portion 103a which overlaps the depression portion 120 and the width of a portion of the semiconductor portion 103b which overlaps the depression portion 120 are equal to each other. Since the depression portion 120 has the extension portions 120a and 120b and the electrode portion 116b of the gate electrode 116 is aligned with the depression portion 120, the length Lb of the electrode portion 116b in the channel length direction is greater than the length La of the electrode portion 116a in the channel length direction. Further, the width Lb1 of an extension portion 116b1 of the electrode portion 116b in the channel length direction and the width Lb2 of an extension portion 116b2 in the channel length direction are equal to each other.

As shown in FIG. 3B, the distance between the source region 111a and the drain region 111b becomes longer in a portion which is separated farther away from the upper portion of the semiconductor structure 103 towards the lower portion. Therefore, if the length of the gate electrode in the channel length direction is kept constant, there occurs a possibility that an offset structure will be made in a lower region of the semiconductor structure 103. In the present embodiment, since the gate electrode 116 has the extension portions 116b1 and 116b2, formation of the offset structure can be prevented. Further, in the present embodiment, the width of the extension portion 120a of the depression portion 120 and the width of the extension portion 120b are made equal to each other, that is, the width Lb1 of the extension portion 116b1 of the gate electrode 116 and the width Lb2 of the extension portion 116b2 are made equal to each other. Therefore, the overlap capacitance between the gate electrode and the source region and the overlap capacitance between the gate electrode and the drain region can be made equal to each other. Further, as will be described later, since the depression portion 120 is not dependent on the lithography process, it can be formed without taking the margin for the alignment error into consideration. Therefore, the overlap capacitance itself can be reduced. Thus, in the present embodiment, the positional relationship between the gate electrode and the source/drain region can be optimized in all of transistors formed in the same wafer or in the same integrated circuit chip and a semiconductor device having excellent characteristics and reliability can be attained.

Further, the channel region can be completely depleted by the gate electrode 116 and occurrence of the punch-through phenomenon between the source and drain can be prevented by setting the width of the semiconductor structure 103 in the channel width direction equal to or less than approximately 20 nm. In addition, since the impurity concentration of the channel region can be set lower than that in the normal planar type MIS transistor, the decrease of mobility in the channel region due to high concentration impurities can be suppressed.

Further, in the present embodiment, the edge portions of the semiconductor portions 103a and 103b of the semiconductor structure 103 are formed in contact with the buried oxide film (underlying insulating film) 102. Therefore, the semiconductor structure 103 can be sufficiently fixedly held and a problem that the semiconductor structure will fall down in the manufacturing process can be prevented.

A manufacturing method of the semiconductor device according to the present embodiment is explained below with reference to FIGS. 4A, 4B and 4C. to FIGS. 14A, 14B and 14C. FIGS. 4A to 14A correspond to the cross sections taken along the A–A' line of FIG. 2, FIGS. 4B to 14B correspond to the cross sections taken along the B–B' line of FIG. 2, and FIGS. 4C to 14C correspond to the cross sections taken along the C–C' line of FIG. 2.

First, as shown in FIGS. 4A, 4B and 4C, an SOI substrate having a (100) p-type silicon substrate (semiconductor substrate) 101 with an impurity concentration of approximately $5 \times 10^{15}$ $cm^{-3}$, a buried oxide film (BOX film: underlying insulating film) 102 with a thickness of approximately 200 nm and a (100) p-type silicon layer (semiconductor layer) 103 with an impurity concentration of approximately $5 \times 10^{15}$ $cm^{-3}$ is prepared. As the SOI substrate, an SOI substrate obtained by subjecting a substrate formed by an SIMOX method to a thermal oxidation process and wet etching process and reducing the thickness thereof or an SOI substrate formed by use of a laminating method may be used. It is preferable to set the thickness of the silicon layer 103 to approximately 10 nm to 30 nm. In this example, it is set to approximately 20 nm. It is preferable to set the uniformity of the thickness of the silicon layer 103 within ±5% in the entire portion of the wafer. The plane direction of the silicon layer 103 is not necessarily set to the same as the plane direction of the silicon substrate 101 and a plane direction which causes the best element characteristic can be set. For example, two silicon substrates may be laminated with an angle of 45 degrees made therebetween and then the silicon layer 103 may be formed by reducing the thickness of one of the two silicon substrates. Further, a glass substrate can be used instead of the silicon substrate 101.

Next, an impurity layer of low concentration (concentration of approximately $5 \times 10^{17}$ $cm^{-3}$) is formed in the channel forming region of the transistor by ion implantation. In this case, however, since the channel of the transistor of the present embodiment can be completely depleted, it is difficult to control the threshold voltage even if an impurity layer is formed in the channel forming region. Therefore, the ion-implantation process for formation of the channel impurity layer can be omitted.

Next, a thermal oxide film 104 with a thickness of approximately 2 nm and a silicon nitride film 105 with a thickness of approximately 50 nm are formed. Then, a resist pattern (not shown) is formed on the silicon nitride film 105 by the lithography process. In this example, the resist pattern is formed by use of an electron beam exposure process. Further, the thermal oxide film 104 and silicon nitride film 105 are processed with the resist pattern used as a mask and a mask layer formed of the thermal oxide film 104 and silicon nitride film 105 is formed.

Next, the silicon layer is etched by using the thus formed mask layer as a mask to form an island-form semiconductor structure (Fin structure) 103. The height (thickness) and width of the semiconductor structure 103 are set to approximately 20 nm. Since damage caused at the etching time may be left behind on the side surface of the semiconductor structure 103 in some cases, a process for eliminating the etching damage is performed. For example, the side surface of the semiconductor structure 103 is oxidized to form a thin oxide film (approximately 1 nm) and a process for eliminating the thin oxide film is performed. Further, the etching damage can be eliminated by use of the ashing process and wet process. If the etching process which causes less etching damage is used, the above process can be omitted. The side surface of the semiconductor structure 103 may be vertically set, but may be inclined with an angle of approximately 85 degrees, for example.

Figure 15A:
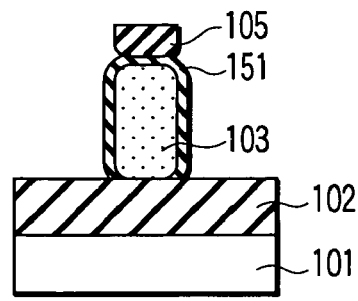
FIGS. 15A and 15B are cross-sectional views showing a modification of the manufacturing process of the semiconductor device according to the first embodiment of this invention.
Figure 15B:
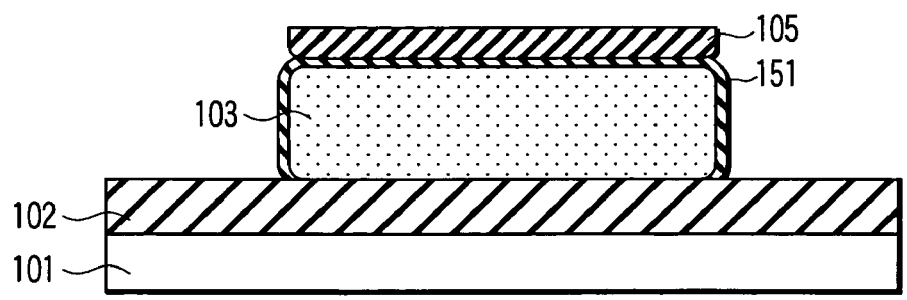

After the semiconductor structure 103 is formed, a thermal oxide film 151 may be formed by a high-temperature thermal oxidation process of approximately 1000° C. as shown in FIGS. 15A and 15B. Thus, the corner portion of the semiconductor structure 103 can be rounded with a radius of approximately 5 nm. By rounding the corner portion of the semiconductor structure 103, concentration of the electric field in the corner portion can be alleviated and it becomes easy to control the threshold voltage.

Figure 5A:
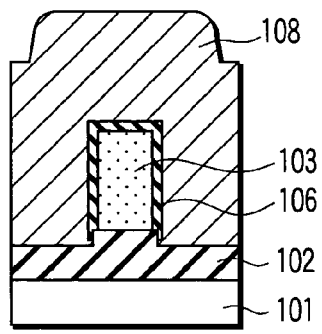
FIGS. 5A to 5C are cross-sectional views showing part of the manufacturing process of the semiconductor device according to the first embodiment of this invention.
Figure 5C:
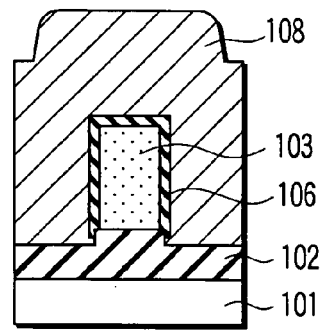
Figure 5B:
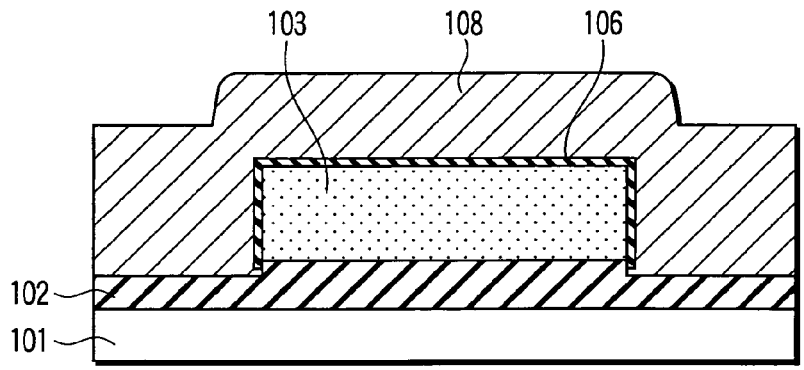

Next, as shown in FIGS. 5A, 5B and 5C, the side surface of the semiconductor structure 103 is covered with an oxide film (not shown). As the oxide film, an oxide film formed in the etching damage eliminating process can be used. Then, the silicon nitride film 105 is removed by use of hot phosphoric acid. Further, the thermal oxide film 104 is removed by the wet etching process. After this, an oxide film 106 with a thickness of approximately 2 nm is formed as a dummy gate insulating film on the upper and side surfaces of the semiconductor structure 103. For formation of the oxide film 106, it is preferable to use an oxygen radical oxidation method which permits an oxide film of high quality to be obtained at low temperatures (for example, approximately 700° C.). The buried oxide film 102 is slightly etched in the etching process for the thermal oxide film 104. The etching condition is adjusted so as to prevent the buried oxide film 102 under the lower surface of the semiconductor structure 103 from being eroded by etching. After this, a polysilicon film 108 with a thickness of approximately 30 nm is deposited on the entire surface.

Figure 6A:
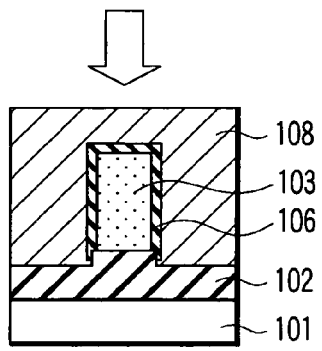
FIGS. 6A to 6C are cross-sectional views showing part of the manufacturing process of the semiconductor device according to the first embodiment of this invention.
Figure 6C:
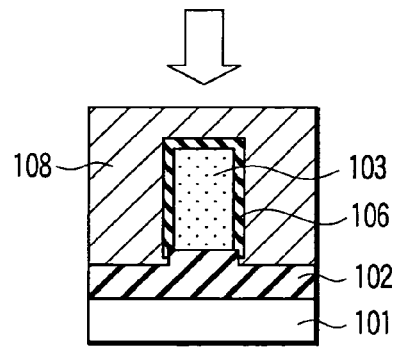
Figure 6B:
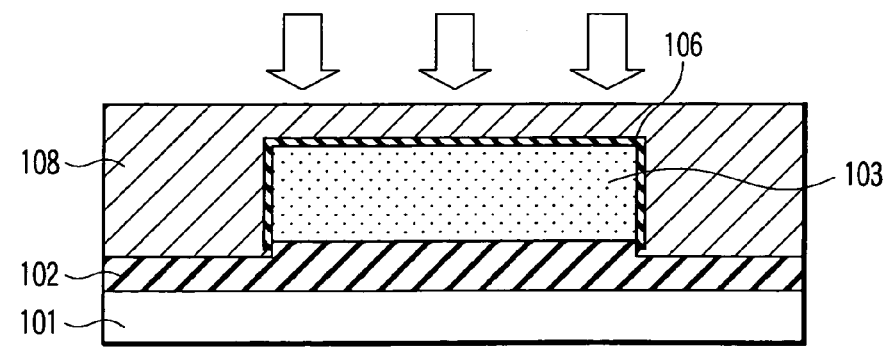

Next, as shown in FIGS. 6A, 6B and 6C, the polysilicon film 108 is made flat by a CMP (Chemical Mechanical Polishing) process, for example.

Figure 7A:
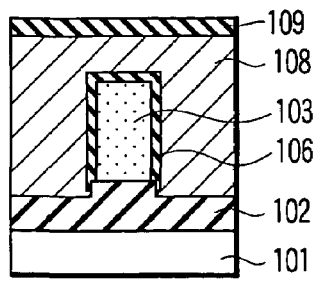
FIGS. 7A to 7C are cross-sectional views showing part of the manufacturing process of the semiconductor device according to the first embodiment of this invention.
Figure 7C:
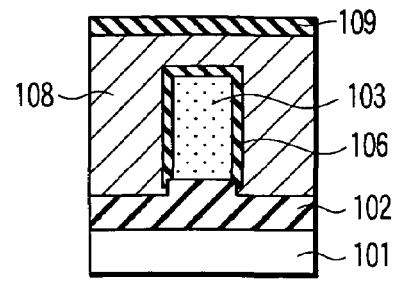
Figure 7B:
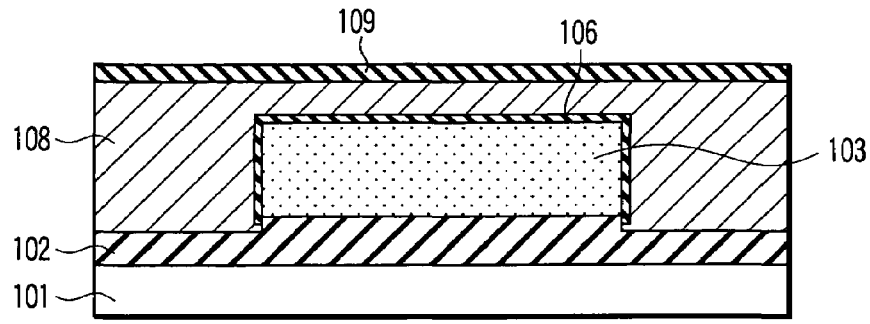

Then, as shown in FIGS. 7A, 7B and 7C, a silicon oxide film 109 with a thickness of approximately 50 nm is formed as a mask layer on the flat polysilicon film 108 by the CVD method.

Figure 8A:
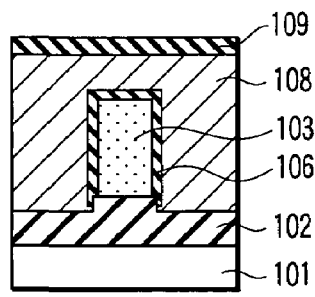
FIGS. 8A to 8C are cross-sectional views showing part of the manufacturing process of the semiconductor device according to the first embodiment of this invention.
Figure 8C:
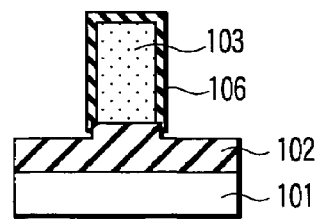
Figure 8B:
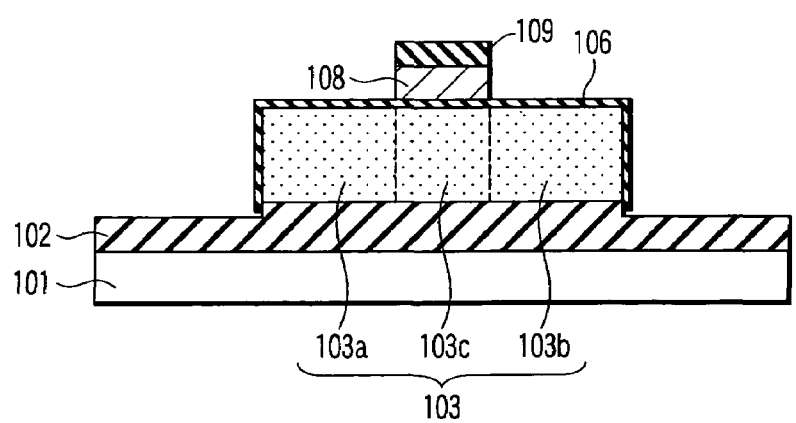

Next, as shown in FIGS. 8A, 8B and 8C, the silicon oxide film 109 is etched by using a resist pattern (not shown) corresponding to a gate electrode pattern as a mask. After the resist pattern is removed, a dummy gate electrode 108 is formed by etching the polysilicon film 108 with the patterned silicon oxide film 109 used as a mask. The etching process is performed in an etching condition of high selective ratio so as to leave the silicon oxide film 106 on the upper and side surfaces of the semiconductor structure 103. A region directly below the thus formed dummy gate electrode 108 corresponds to the semiconductor portion 103c of the semiconductor structure 103.

Figures 9A, 9C:
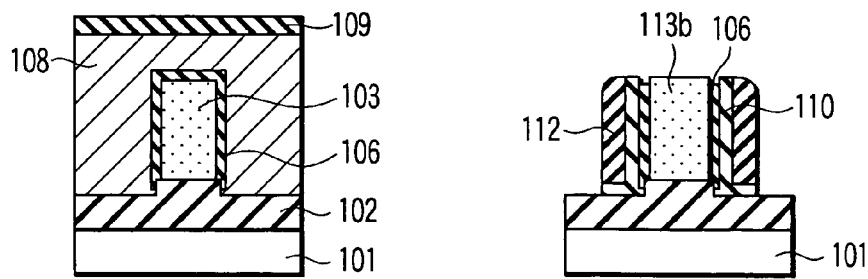
FIGS. 9A to 9C are cross-sectional views showing part of the manufacturing process of the semiconductor device according to the first embodiment of this invention.
Figure 9B:
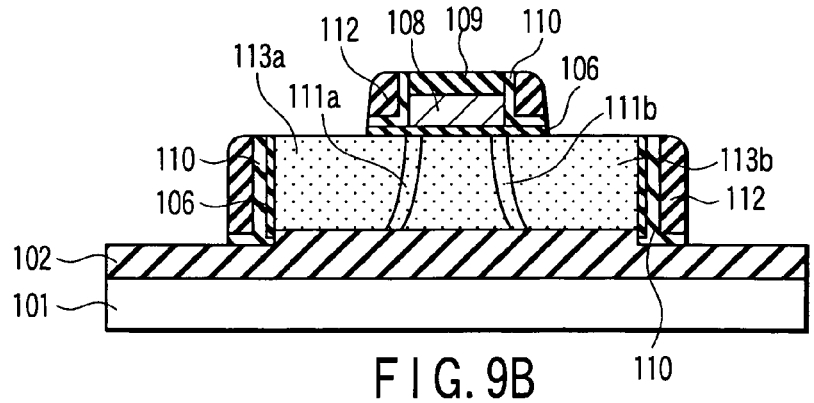

Next, as shown in FIGS. 9A, 9B and 9C, a silicon nitride film 110 with a thickness of approximately 10 nm is deposited on the side surfaces of the dummy gate electrode 108 and silicon oxide film 109. Then, impurities are ion-implanted with the silicon oxide film 109 and dummy gate electrode 108 used as a mask to form a source region 111a and drain region 111b of low impurity concentration in the semiconductor structure 103. After this, a silicon oxide film 112 with a thickness of approximately 10 nm is deposited. Next, the silicon oxide film 112 and silicon nitride film 110 are etched by an RIE process. As a result, portions of the silicon oxide film 112 and silicon nitride film 110 are left behind along the side wall of the dummy gate electrode 108. At this time, the silicon oxide film 112 and silicon nitride film 110 are also left behind on the side wall of the semiconductor structure 103. Then, an ion implantation process of arsenic (As) ions is performed to form a source region 113a and drain region 113b of high impurity concentration in the semiconductor structure 103. In this example, both of the source/drain regions (extension regions) of low impurity concentration and the source/drain regions of high impurity concentrations are formed, but it is also possible to use single source/drain regions.

Figures 10A, 10C:
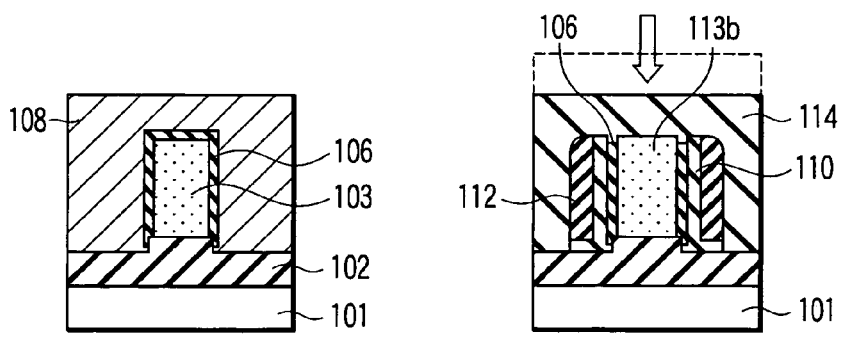
FIGS. 10A to 10C are cross-sectional views showing part of the manufacturing process of the semiconductor device according to the first embodiment of this invention.
Figure 10B:
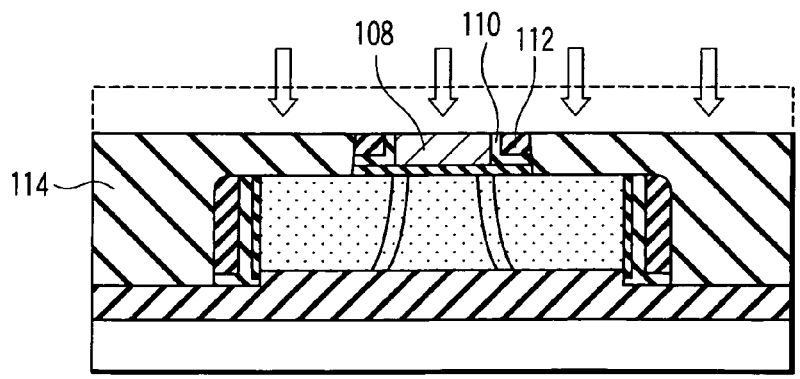

Next, as shown in FIGS. 10A, 10B and 10C, a silicon oxide film 114 (interlayer insulating film) with a thickness of approximately 100 nm is deposited on the entire surface by the CVD method. Then, a heat treatment of 1000° C. for about 10 seconds is performed by an RTA (Rapid Thermal Annealing) method. The heat treatment is also used as an activation process for the source/drain regions. In the heat treatment, the heat treatment temperature is set so as to prevent impurities of the source/drain regions from being excessively diffused and prevent the channel length from becoming excessively small. After this, the silicon oxide film 114 is made flat by the CMP method to expose the surface of the dummy gate electrode 108.

Figure 11A:
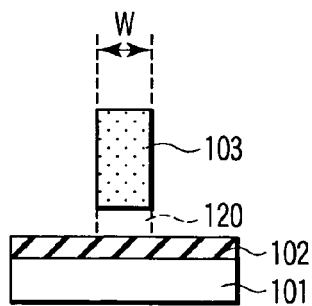
FIGS. 11A to 11C are cross-sectional views showing part of the manufacturing process of the semiconductor device according to the first embodiment of this invention.
Figure 11C:
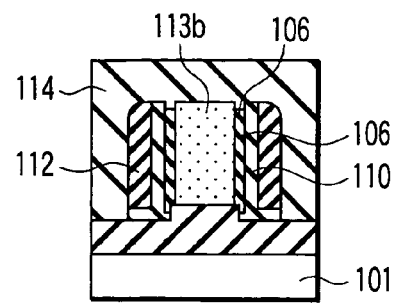
Figure 11B:
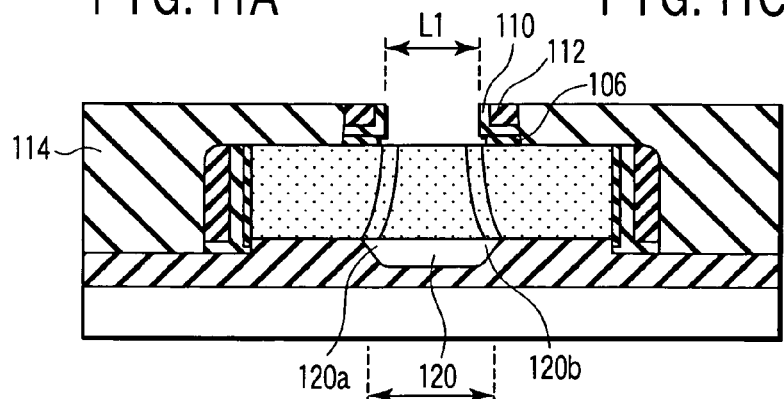

Next, as shown in FIGS. 11A, 11B and 11C, the exposed dummy gate electrode 108 is selectively removed by a chemical dry etching process using $CF_4$ gas and $N_2$ gas. As a result, the surfaces of the buried oxide film 102 and silicon oxide film 106 under the dummy gate electrode 108 are exposed. The silicon oxide film 112 and silicon nitride film 110 formed on the side wall of the dummy gate electrode 108 are scarcely etched.

Then, the exposed buried oxide film 102 and silicon oxide film 106 are etched by a wet etching process using, for example, dilute hydrofluoric acid to form a depression portion 120 in the buried oxide film 102. The side surface of the silicon oxide film 114 is protected by the silicon nitride film 110 and is not etched. Since the etching process is an isotropic etching process, the etching proceeds in depth and lateral directions and an adjacent portion of the exposed buried oxide film 102 is also etched. Therefore, the etching proceeds to a region directly under the semiconductor structure 103 and the depression portion 120 is formed in the entire portion under the semiconductor portion 103*c*. Further, extension portions 120*a* and 120*b* are formed under the semiconductor portions 103*a* and 103*b*. The widths of the extension portions 120*a* and 120*b* in the channel length direction are set equal to each other.

In the present embodiment, since the depression portion 120 is formed in the entire portion under the semiconductor portion 103*c*, it is necessary to set the etching width in the lateral direction (the widths of the extension portions 120*a* and 120*b*) to at least W/2 in the case where the width of the semiconductor structure 103 is set to W. Further, in order to form the depression portion 120 in the entire portion under the semiconductor portion 103*c* without fail, the etching amount is so set to make the etching width greater than W/2. However, if the etching width is set excessively, the overlap width of the gate electrode and the source/drain region will become great when the gate electrode is formed in the depression portion 120. Therefore, it is desirable to set the etching width equal to or less than W. In the present embodiment, since the width W of the semiconductor structure 103 is 20 nm, the etching width is set to 15 nm. That is, the widths of the extension portions 120*a* and 120*b* are set to 15 nm.

Figure 12A:
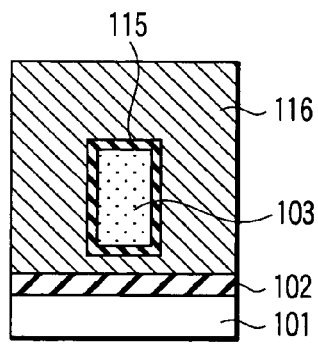
FIGS. 12A to 12C are cross-sectional views showing part of the manufacturing process of the semiconductor device according to the first embodiment of this invention.
Figure 12C:
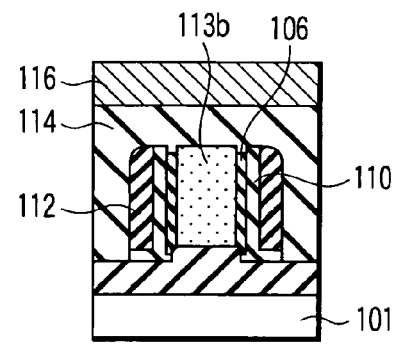
Figure 12B:
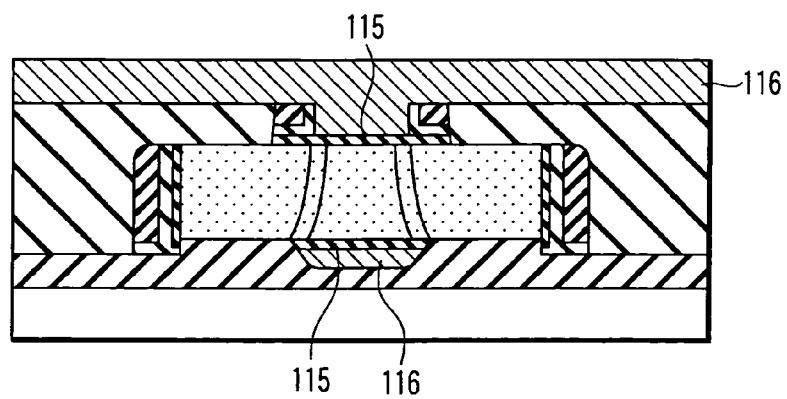

Next, as shown in FIGS. 12A, 12B and 12C, a silicon oxide film with a thickness of approximately 1.5 nm is formed at a temperature of approximately 700° C. on the exposed surface of the semiconductor structure 103 by a radical oxidation method. Further, the silicon oxide film surface is nitrided by a radical nitriding method to form a gate insulating film 115 which is formed of a silicon oxynitride film (SiON film). By using the radical oxidation method, a silicon oxide film which is less irregular can be formed on the surface of the semiconductor structure 103. Therefore, a lowering in the channel mobility caused by channel interface scattering can be suppressed. Further, in the radical oxidation process, since the film thickness of the silicon oxide film is determined by the temperature, a variation in the film thickness of the silicon oxide film can be suppressed.

As the gate insulating film 115, a high dielectric constant film formed of a metal oxide such as a tantalum oxide film ($Ta_2O_5$ film), an HfSiON film formed by adding nitrogen to an Hf silicate film, an $HfO_2$ film, a Zr silicate film, or the like can be used. The relative dielectric constant εr of the $Ta_2O_5$ film, for example, is approximately 20 to 27 and is considerably greater than the relative dielectric constant εr (approximately 3.9) of the silicon oxide film. Therefore, the equivalent oxide film thickness can be set equal to or less than 1 nm. Further, a silicon oxide film with a thickness of approximately 0.5 nm may be formed to reduce the interface state density and a high dielectric constant film such as a $Ta_2O_5$ film may be formed on the silicon oxide film. In addition, a high dielectric constant film can be formed by use of an ALD (Atomic Layer Deposition) CVD method. For example, an $SiO_2$ film (relative dielectric constant: approximately 3.9) with a thickness of approximately 0.3 nm by use of the ALD method, an $HfO_2$ film (relative dielectric constant: approximately 25) with a thickness of approximately 1 nm by use of the ALD method, and an $Si_3N_4$ film (relative dielectric constant: approximately 7.0) with a thickness of approximately 0.3 nm by use of the ALD method may be sequentially formed at low temperatures (approximately 200 to 500° C.). Further, after formation of the films, an anneal process of approximately 400° C. may be performed.

Next, a polysilicon film 116 is deposited to a thickness of approximately 60 nm on the entire surface at a temperature of approximately 700° C. by an LPCVD method using silane gas, for example. The polysilicon film 116 is also formed in the depression portion 120 under the semiconductor structure 103. N-type impurities (As, P or the like) with a concentration of approximately $3 \times 10^{20}$ cm$^{-3}$ are doped into the polysilicon film of an N-channel transistor region and P-type impurities (B or the like) with a concentration of approximately $3 \times 10^{20}$ cm$^{-3}$ are doped into the polysilicon film of a P-channel transistor region by the ion implantation process, for example. Further, the activation process is performed at 900° C. for approximately 10 seconds by RTA.

In order to lower the resistance of the gate electrode, a metal film (TiN film, Mo film, W film, Al film or the like) or a metal silicide film (nickel silicide (NiSi) film, cobalt silicide (CoSi) film, titanium silicide ($TiSi_2$) film or the like) may be used as the gate electrode. Further, a stack film of a polysilicon film and metal film or a stack film of a polysilicon film and metal silicide film may be used as the gate electrode. In addition, the alignment state of the gate electrode material such as TiN can be adjusted and the threshold voltage of the transistor can be adjusted by using a difference between the work functions of the gate insulating film and gate electrode. After N-type impurities are doped into the polysilicon film of the N-channel transistor region and P-type impurities are doped into the polysilicon film of the P-channel transistor region, a Ni film is formed on the polysilicon film and a Ni silicide film is formed by performing the heat treatment to react the Ni film with the polysilicon film. Thus, optimum work functions can be given to the gate electrodes of the N-channel and P-channel transistors. In this case, the work function of the Ni silicide electrode of the N-channel transistor can be set to approximately 4.2 eV and the work function of the Ni silicide electrode of the P-channel transistor can be set to approximately 4.9 eV.

Figure 13A:
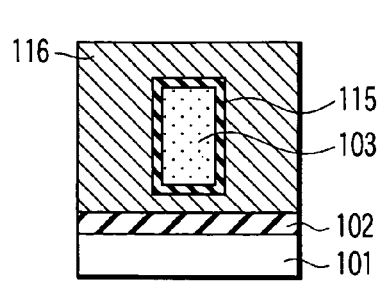
FIGS. 13A to 13C are cross-sectional views showing part of the manufacturing process of the semiconductor device according to the first embodiment of this invention.
Figure 13C:
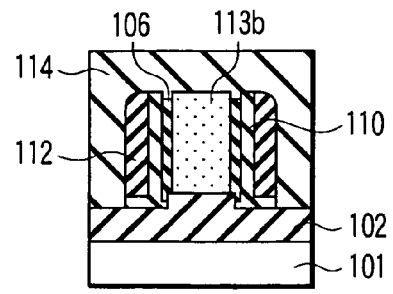
Figure 13B:
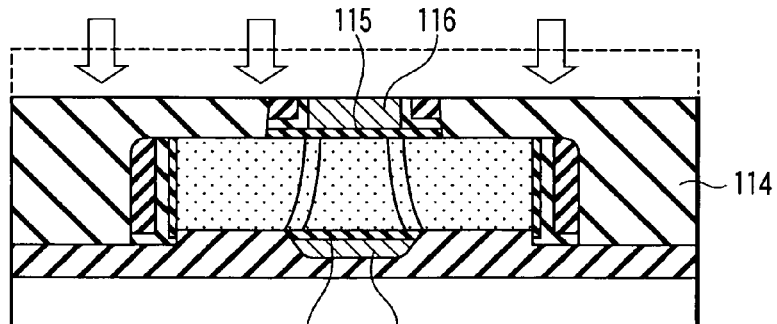
Figure 16:
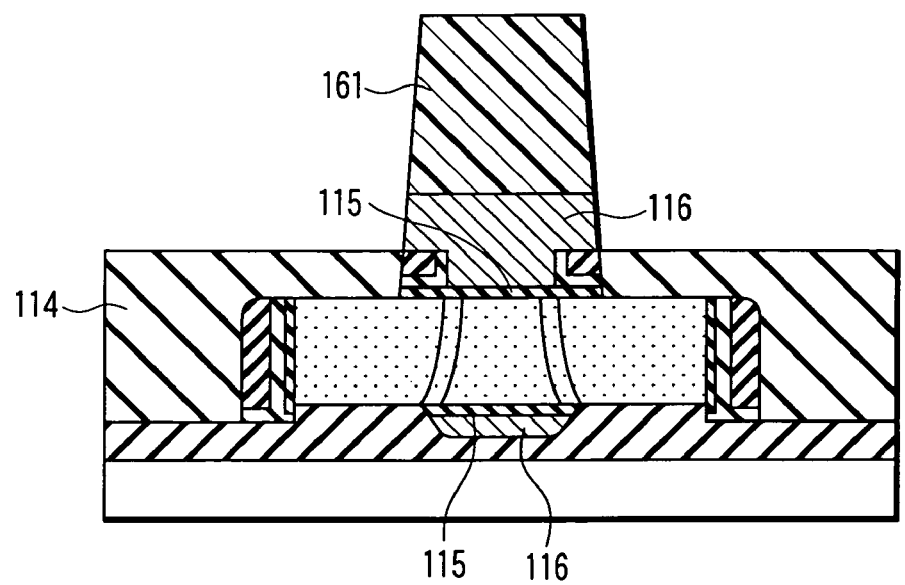
FIG. 16 is a cross-sectional view showing a modification of the manufacturing process of the semiconductor device according to the first embodiment of this invention.

Next, as shown in FIGS. 13A, 13B and 13C, the polysilicon film 116 is subjected to the flattening process by the CMP method. In the flattening process, a portion of the polysilicon film 116 which lies on the interlayer insulating film 114 is removed. Thus, a gate electrode 116 which surrounds the semiconductor structure 103 is formed. As shown in FIG. 16, the polysilicon film 116 may be patterned with the resist pattern 161 used as a mask. In this case, a T-shaped gate electrode 116 can be formed and the wiring resistance of the gate electrode can be lowered.

Figure 14A:
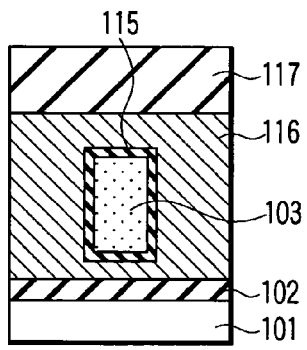
FIGS. 14A to 14C are cross-sectional views showing part of the manufacturing process of the semiconductor device according to the first embodiment of this invention.
Figure 14C:
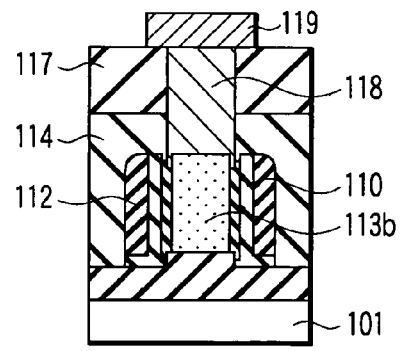
Figure 14B:
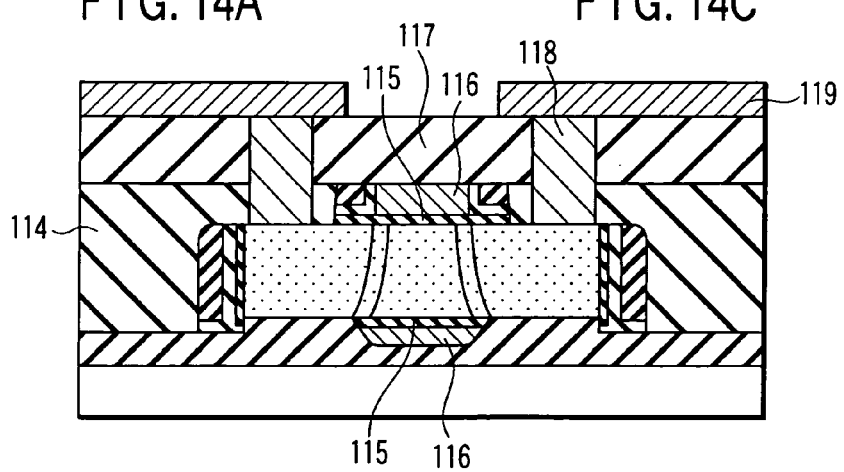

Next, as shown in FIGS. 14A, 14B and 14C, a silicon oxide film is deposited as an interlayer insulating film 117 on the entire surface by the CVD method. Then, contact holes are formed in the interlayer insulating film 117. Further, the contact holes are filled with a W film, Al film or TiN film/Ti film to form contact plugs 118. After this, an Al wiring 119 connected to the contact plugs 118 is formed. Then, a passivation film (not shown) is formed on the entire surface.

Thus, according to the manufacturing method of the present embodiment, the buried oxide film 102 is exposed by removing the dummy gate electrode 108 and the exposed portion of the buried oxide film 102 is etched and removed to form the depression portion 120. Since the buried oxide film 102 is isotropically etched, the depression portion 120 extends to under the semiconductor portions 103*a* and 103*b* of the semiconductor structure 103 and the widths of the extension portions 120*a* and 120*b* become equal to each other. Therefore, the width in the channel direction of the electrode portion 116*b* of the gate electrode 116 formed in the depression portion 120 can be increased and the overlap width of the gate electrode and the source region and the overlap width of the gate electrode and the drain region can be made equal to each other. As a result, as is already described, the positional relationship between the gate electrode and the source/drain region can be optimized for all transistors formed in the same wafer or the same integrated circuit chip. Thus, a semiconductor device which is excellent in characteristics and reliability can be attained.

Further, in the step after the semiconductor structure 103 is formed, the edge portions of the semiconductor portions 103a and 103b of the semiconductor structure 103 are formed in contact with the buried oxide film 102. Therefore, the semiconductor structure 103 can be sufficiently fixedly held during the manufacturing process and occurrence of a problem that the semiconductor structure 103 will fall down in the manufacturing process can be prevented.

Embodiment 2

Figure 17:
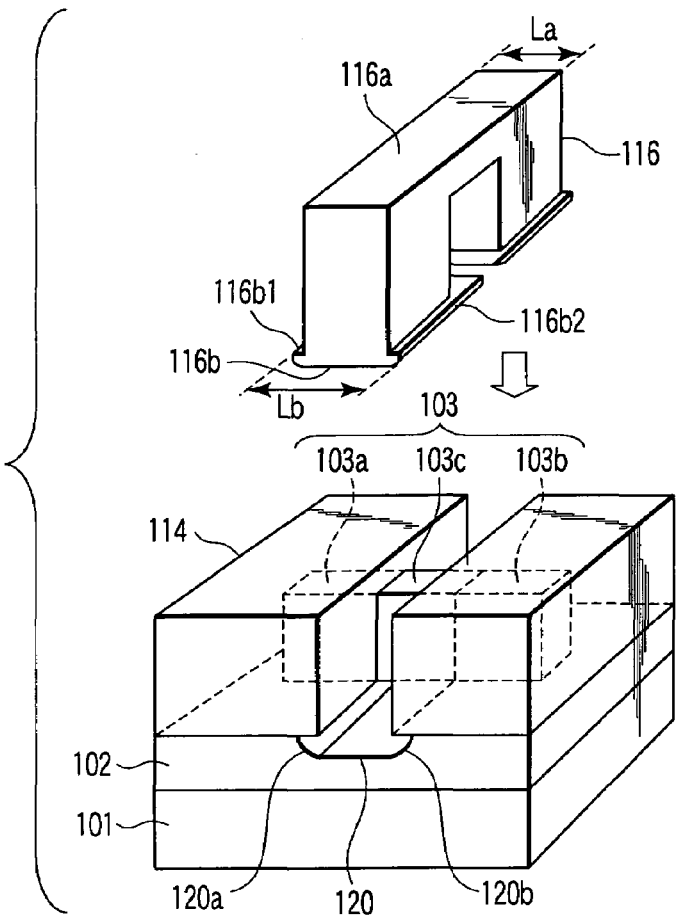
FIG. 17 is a perspective view schematically showing the basic configuration of a semiconductor device according to a second embodiment of this invention.
Figure 18:
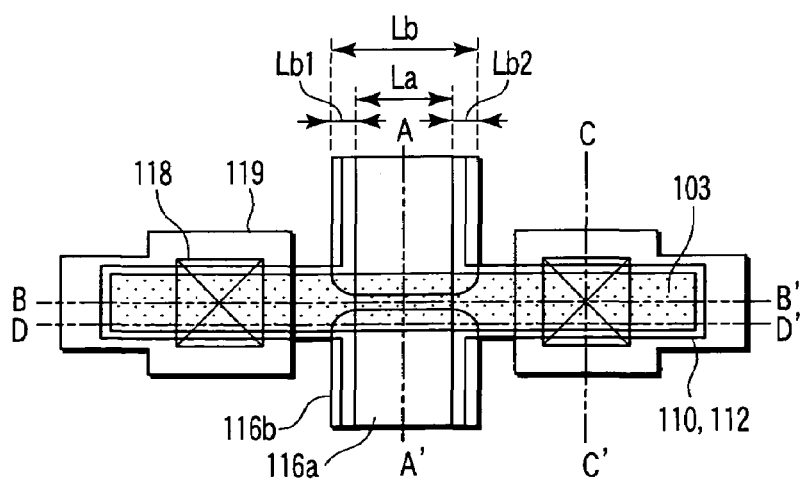
FIG. 18 is a plan view schematically showing the basic configuration of the semiconductor device according to the second embodiment of this invention.
Figure 19A:
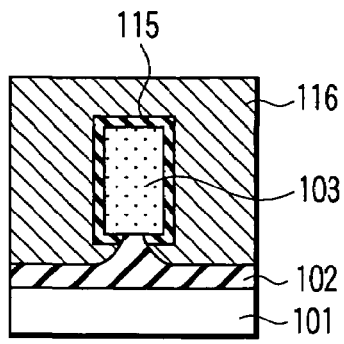
FIGS. 19A to 19D are cross-sectional views each schematically showing the basic configuration of the semiconductor device according to the second embodiment of this invention.
Figure 19C:
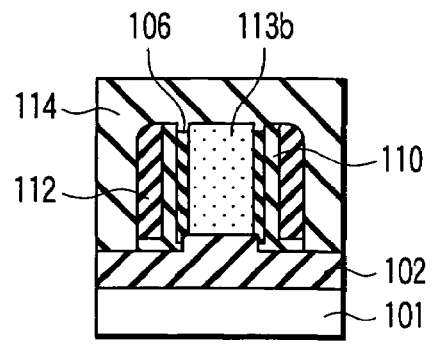
Figure 19B:
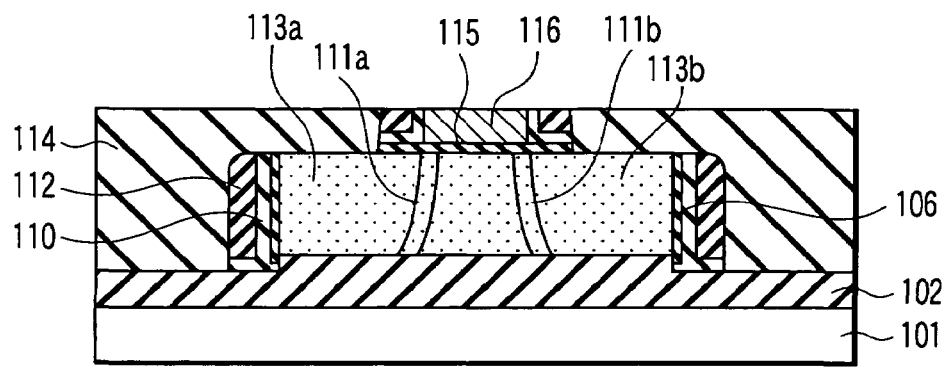
Figure 19D:
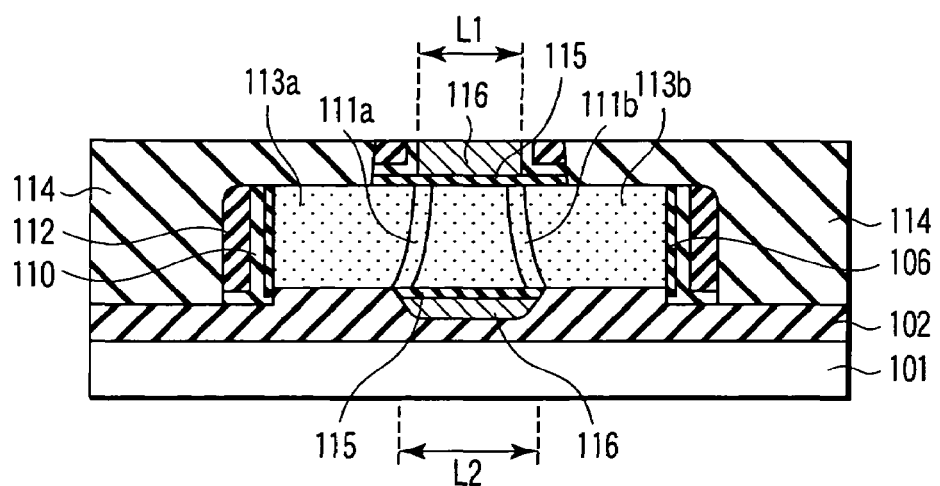

FIG. 17 is a perspective view showing the configuration of a semiconductor device according to a second embodiment of this invention and FIG. 18 is a plan view of the semiconductor device shown in FIG. 17. FIG. 19A is a cross sectional view taken along the A–A' line of FIG. 18, FIG. 19B is a cross sectional view taken along the B–B' line of FIG. 18, FIG. 19C is a cross sectional view taken along the C–C' line of FIG. 18, and FIG. 19D is a cross sectional view taken along the D–D' line of FIG. 18. In FIG. 17, for easy understanding of the structure, the gate electrode is drawn to be separated from the other structure, but in practice, the gate electrode is formed in contact with the other structure. Further, in FIGS. 17 and 19A to 19D, contacts and wirings shown in FIG. 18 are omitted. The basic configuration of the present embodiment is the same as that of the first embodiment. The same reference numbers are attached to the same constituents as those of the first embodiment and the explanation therefor is omitted.

In the first embodiment, the electrode portion 116b of the gate electrode 116 is formed to cover the entire portion of the undersurface of the semiconductor portion 103c of the semiconductor structure 103. However, in the present embodiment, the electrode portion 116b is formed to partly cover the undersurface of the semiconductor portion 103c. That is, the gate electrode 106 does not completely surround the semiconductor portion 103c and the gate electrode 106 is discontinuous in a region under the central portion of the semiconductor portion 103c. The other basic configuration is the same as that in the first embodiment.

The basic manufacturing method of the semiconductor device of the present embodiment is also the same as in the first embodiment. However, in the present embodiment, in the step of FIGS. 11A, 11B and 11C shown in the first embodiment, the buried oxide film 102 is left behind in the central portion of the semiconductor portion 103c without forming the depression portion 120 in the entire portion under the semiconductor portion 103c when the buried oxide film 102 is etched and removed to form the depression portion 120. Therefore, when the width of the semiconductor structure 103 is set to W, it is possible to set the etching width (the widths of the extension portions 120a and 120b of the depression portion 120) less than W/2.

As described above, since the basic configuration of the semiconductor device of the present embodiment and the basic manufacturing method thereof are the same as those of the first embodiment, the same effect as that of the first embodiment can be attained. Further, in the present embodiment, since the widths of the extension portions 120a and 120b of the depression portion 120 can be made small, the overlap width of the gate electrode and the source/drain region can be made small and the overlap capacitance can be reduced.

Embodiment 3

FIGS. 20 and 21 are a plan view showing an example of the configuration of a semiconductor device according to the present embodiment. The basic configuration of the semiconductor device shown in FIG. 20 corresponds to the configuration of the first embodiment. Further, the basic configuration of the semiconductor device shown in FIG. 21 corresponds to the configuration of the second embodiment. Therefore, detailed explanation of the respective constituents is omitted.

In the first and second embodiments, the shape of the semiconductor structure 103 is a rectangular parallelepiped form and the width of the semiconductor structure 103 in the channel width direction is uniform. However, in the present embodiment, the width of the semiconductor structure 103 in the channel width direction is greater in the semiconductor portions 103a and 103b than in the semiconductor portion 103c. Therefore, it is possible to easily form the contact holes for the source/drain regions and suppress a rise and a variation in the contact resistance.

Embodiment 4

Figure 23:
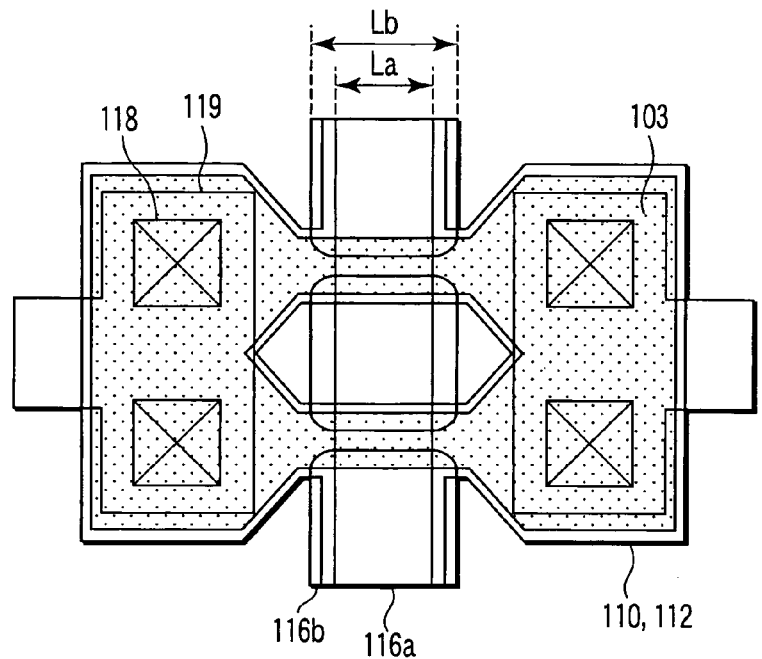
FIG. 23 is a plan view schematically showing another example of the basic configuration of the semiconductor device according to the fourth embodiment of this invention.

FIGS. 22 and 23 are a plan view showing an example of the configuration of a semiconductor device according to the present embodiment. The basic configuration of the semiconductor device shown in FIG. 22 corresponds to the configuration of the first embodiment. Further, the basic configuration of the semiconductor device shown in FIG. 23 corresponds to the configuration of the second embodiment. Therefore, detailed explanation of the respective constituents is omitted.

In the present embodiment, semiconductor structures 103 as shown in FIG. 20 or 21 are arranged in parallel, semiconductor portions 103c are separately disposed and semiconductor portions 103a and 103b are commonly used. A gate electrode 116 is commonly used and one transistor is configured by the configuration shown in the drawing.

With the above configuration, the effective channel width of the transistor can be increased without significantly increasing the occupied area of the transistor. Therefore, a high performance semiconductor integrated circuit can be formed with high density.

Embodiment 5

Figure 24:
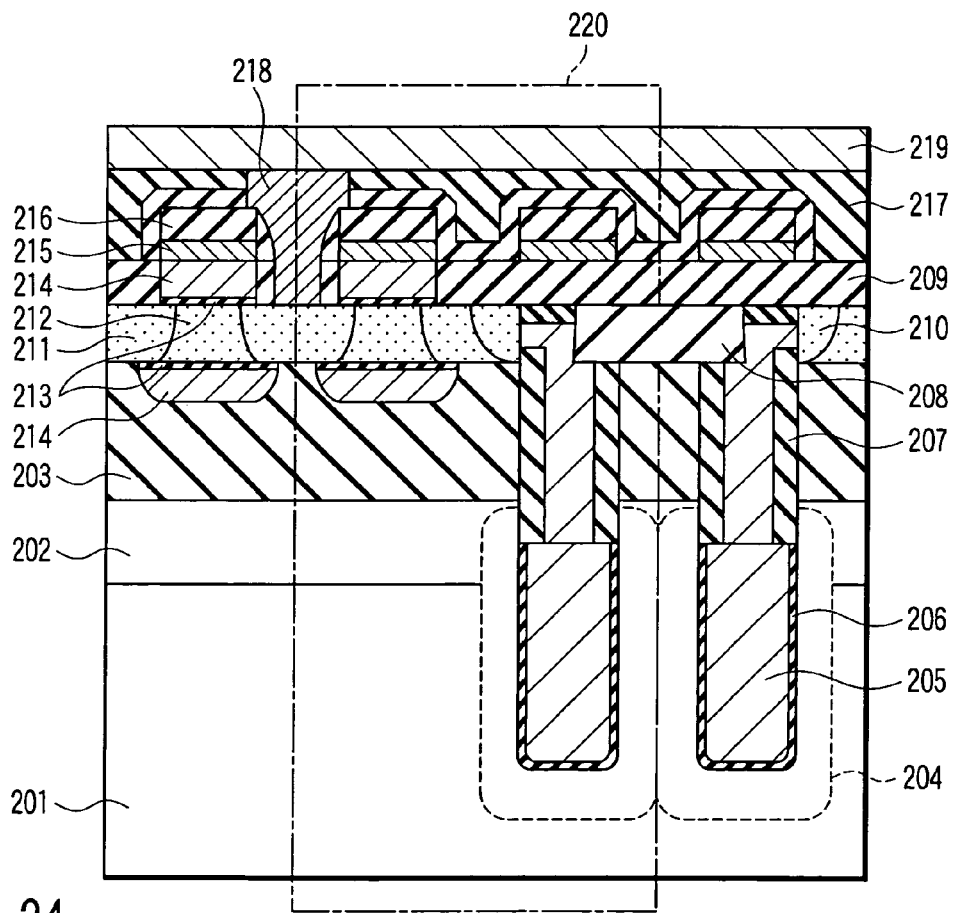
FIG. 24 is a cross-sectional view schematically showing the configuration of a semiconductor device according to a fifth embodiment of this invention.

FIG. 24 is a cross sectional view showing one example of a configuration obtained when the transistor structure shown in the first or second embodiment is applied to a DRAM having a trench type capacitor structure.

In FIG. 24, a reference symbol 201 denotes a P-type silicon substrate, 202 an N well (plate electrode), 203 a buried oxide film (BOX film), 204 an $n^-$-type diffusion layer, 205 an $n^+$-type polysilicon layer, 206 a capacitor insulating film, 207 a Collar insulating film, 208 an isolation insulating film, 209 a buried insulating film, and 210 a side wall contact. Further, a reference symbol 211 denotes a source/drain region, 212 a channel forming region, 213 a gate insulating film, 214 a polysilicon film used as a gate electrode, and 215 a silicide film. A reference symbol 216 denotes a silicon nitride film formed on the silicide film 215, 217 an interlayer insulating film, 218 a bit line contact, and 219 a bit line. In addition, a reference symbol 220 denotes a 1-bit memory cell region.

As shown in FIG. 24, the source/drain region 211 and the storage electrode ($n^+$-type polysilicon layer 205) of the capacitor are electrically connected to each other at the upper side surface of the trench via the side wall contact 210. In the conventional planar type MIS transistor structure, the side wall contact region is formed deeper in the vertical direction, which prevents the source/drain region from being made thin.

By using the MIS transistor structure of the present embodiment, even if the diffusion layer from the side wall contact gives an influence to the source/drain region and the source/drain region is formed deeper, the influence can be fully suppressed by the gate electrode formed on the side surface of the semiconductor structure. That is, the short channel effect caused by extension of the diffusion layer from the side wall contact can be suppressed.

Thus, by applying the transistor structure as shown in the first or second embodiment to a DRAM having a trench type capacitor structure, a high performance DRAM can be attained.

Embodiment 6

Figure 25:
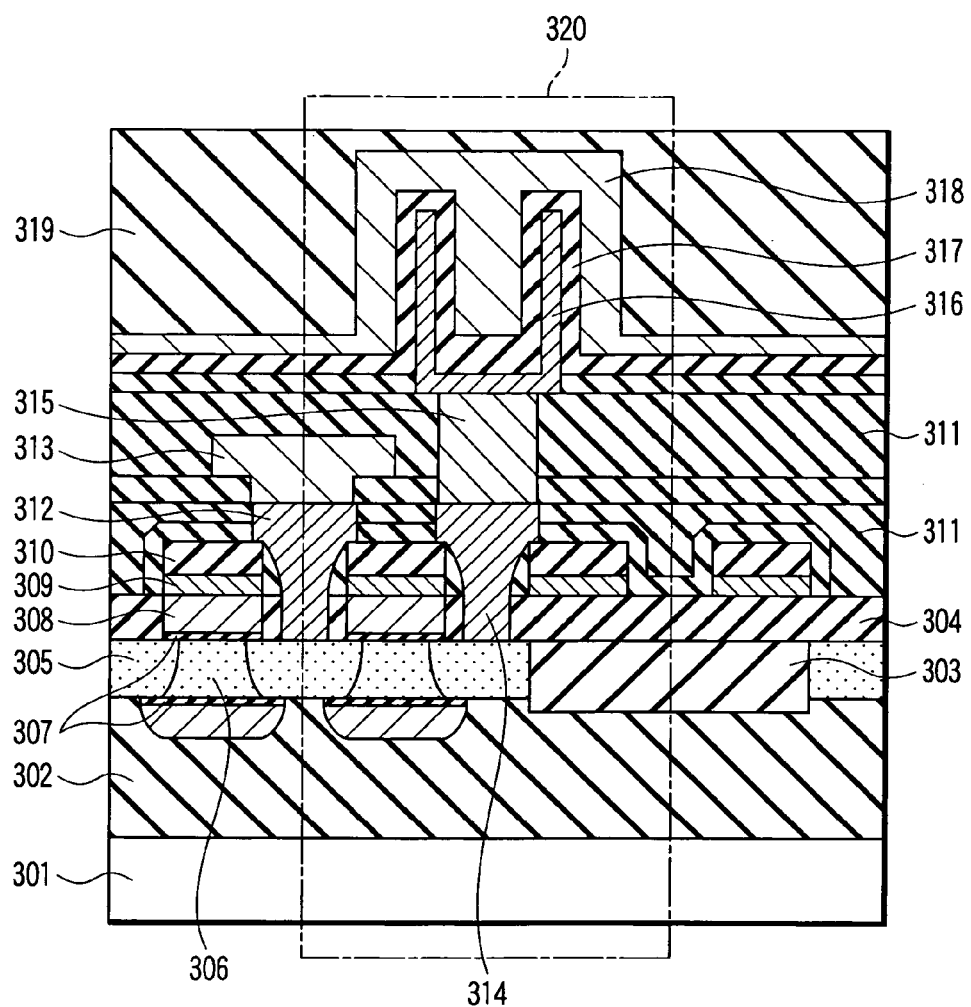
FIG. 25 is a cross-sectional view schematically showing the configuration of a semiconductor device according to a sixth embodiment of this invention.

FIG. 25 is a cross sectional view showing one example of a configuration obtained when the transistor structure shown in the first or second embodiment is applied to a DRAM having a stack type capacitor structure.

In FIG. 25, a reference symbol 301 denotes a P-type silicon substrate, 302 a buried oxide film (BOX film), 303 an isolation insulating film, 304 a buried insulating film, 305 a source/drain region, 306 a channel forming region, and 307 a gate insulating film. A reference symbol 308 denotes a polysilicon film used as a gate electrode and 309 denotes a silicide film. A reference symbol 310 denotes a silicon nitride film formed on the silicide film 309. A reference symbol 311 denotes an interlayer insulating film, 312 a bit line contact, 313 a bit line, and 314 and 315 SN (storage node) contacts. Further, a reference symbol 316 denotes an SN electrode, 317 a capacitor insulating film, 318 a plate electrode, and 319 an interlayer insulating film. A reference symbol 320 denotes a 1-bit memory cell region.

In the present embodiment, the SN contact 314 and the bit line contact 312 formed by use of polysilicon are formed to extend to above the gate electrode. In the conventional planar type MIS transistor structure, since the contact region is made fine, it is difficult to sufficiently reduce the contact resistance. In the MIS transistor structure of the present embodiment, since the contact can be formed by utilizing not only the plane portion but also the side surface portion, the contact resistance can be reduced.

Further, in the stack type capacitor using a high dielectric constant film such as a BST film, STO film or $Ta_2O_5$ film, the capacitor is formed after the MIS transistor is formed. However, at the time of capacitor formation, a high-temperature process such as a crystallization annealing process at approximately 750° C. is performed. Therefore, the source/drain diffusion layer is formed deeper and there occurs a problem that the short channel effect occurs. By using the MIS transistor structure of the present embodiment, the short channel effect can be sufficiently suppressed. That is, the short channel effect caused by extension of the source/drain diffusion layer in the capacitor formation process can be sufficiently suppressed.

In the example shown in the drawing, the capacitor is formed above the bit line, but the bit line can be formed above the capacitor or the capacitor can be formed above the wiring.

Thus, by applying the transistor structure as shown in the first or second embodiment to a DRAM having a stack type capacitor structure, a high performance DRAM can be attained.

In each of the above embodiments, the N-channel transistor is mainly explained as an example. However, the configuration and the manufacturing method explained in each of the above embodiments can be applied in the same manner when a P-channel transistor is used. Further, the MIS transistor explained in each of the above embodiments and a normal planar type MIS transistor may be formed within the same wafer or in the same chip. In addition, a plurality of MIS transistors explained in each of the above embodiments can be used to configure a flash memory, SRAM, DRAM, various types of logic circuits, CPU or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an underlying insulating film having a depression;
a semiconductor structure which includes a first semiconductor portion having a portion formed on the underlying insulating film and a first overlap portion which overlaps the depression and containing an impurity element for source/drain, a second semiconductor portion having a portion formed on the underlying insulating film and a second overlap portion which overlaps the depression and is disposed to face the first overlap portion and containing an impurity element for source/drain, and a third semiconductor portion disposed between the first and second semiconductor portions and having a portion disposed above the depression, wherein overlap width of the first overlap portion and overlap width of the second overlap portion are equal to each other;
a gate electrode including a first electrode portion covering upper and side surfaces of the third semiconductor portion and a second electrode portion formed in the depression, wherein the second electrode portion has a bottom which is formed on the underlying insulating film; and
a gate insulating film interposed between the semiconductor structure and the gate electrode.

2. The semiconductor device according to claim 1, wherein the second electrode portion entirely covers a lower surface of the third semiconductor portion.

3. The semiconductor device according to claim 2, wherein the overlap width is greater than ½ of a width of the third semiconductor portion.

4. The semiconductor device according to claim 1, wherein the second electrode portion partly covers a lower surface of the third semiconductor portion.

5. The semiconductor device according to claim 4, wherein the overlap width is smaller than ½ of a width of the third semiconductor portion.

6. The semiconductor device according to claim 4, wherein that part of the second electrode portion which partly covers the lower surface of the third semiconductor portion has a width equal to the overlap width.

7. The semiconductor device according to claim 1, wherein edge portions of the first and second semiconductor portions are formed in contact with the underlying insulating film.

8. The semiconductor device according to claim 1, wherein a width of the second electrode portion in a channel length direction is greater than a width of the first electrode portion in a channel length direction.

9. The semiconductor device according to claim 1, wherein the second electrode portion is aligned with the depression.

10. The semiconductor device according to claim 1, wherein a distance between source and drain regions containing the impurity element is greater in a lower portion of the semiconductor structure than in an upper portion thereof.

11. The semiconductor device according to claim 1, wherein each of the first and second semiconductor portions has a width greater than that of the third semiconductor portion.

12. The semiconductor device according to claim 1, wherein a width of the second electrode portion in a channel length direction is greater in an upper part of the second electrode portion than in a lower part of the second electrode portion.

* * * * *